(12) United States Patent
Lee

(10) Patent No.: US 7,035,143 B2
(45) Date of Patent: Apr. 25, 2006

(54) NAND FLASH MEMORY DEVICE AND METHOD OF READING THE SAME

(75) Inventor: Hee Youl Lee, Kyungki-Do (KR)

(73) Assignee: Hynix Semiconductor Inc., Kyungki-Do (KR)

( * ) Notice: Subject to any disclaimer, the term of this patent is extended or adjusted under 35 U.S.C. 154(b) by 27 days.

(21) Appl. No.: 10/876,319

(22) Filed: Jun. 24, 2004

(65) Prior Publication Data
US 2005/0226048 A1 Oct. 13, 2005

(30) Foreign Application Priority Data
Apr. 1, 2004 (KR) ...................... 10-2004-0022677

(51) Int. Cl.
*G11C 16/04* (2006.01)
*G11C 8/00* (2006.01)
*G11C 19/08* (2006.01)

(52) U.S. Cl. ........................... 365/185.17; 365/185.11; 365/230.03; 365/230.06; 365/16

(58) Field of Classification Search ........... 365/185.17, 365/185.11, 230.03, 230.06, 16
See application file for complete search history.

(56) References Cited
U.S. PATENT DOCUMENTS 5,969,990 A * 10/1999 Arase .................... 365/185.25
6,731,540 B1 * 5/2004 Lee et al. ............... 365/185.17
6,956,769 B1 * 10/2005 Lee ........................ 365/185.09
2002/0186590 A1 * 12/2002 Lee ........................ 365/185.17
2004/0080980 A1 * 4/2004 Lee ........................ 365/185.17
2005/0232012 A1 * 10/2005 Park ....................... 365/185.17

* cited by examiner

*Primary Examiner*—George Eckert
*Assistant Examiner*—Anthan Tran
(74) *Attorney, Agent, or Firm*—Marshall, Gerstein & Borun LLP

(57) ABSTRACT

Provided is related to a NAND flash memory device and method of reading the same, in which during a read operation, a ground voltage is applied to string and ground selection transistors of deselected cell blocks so as to increase resistance of a string line to prevent leakage currents due to a back-bias effect. A reduced bitline leakage current increases an ON/OFF current ratio between programmed and erased cells to reduce a sensing time therein, which makes a read trip range so as to prevent variation of threshold voltages due to data retention and reading disturbance. Voltages can be independently applied to source selection lines by electrically isolating source selection transistors between the cell blocks. It is available to reduce the number of source discharge transistors by electrically connecting the source selection transistors between adjacent cell blocks.

12 Claims, 4 Drawing Sheets

NAND FLASH MEMORY DEVICE AND METHOD OF READING THE SAME

This application relies for priority upon Korean Patent Application No. 2004-0022677 filed on Apr. 1, 2004, the contents of which are herein incorporated by reference in their entirety.

BACKGROUND

1. Field of the Invention

The present invention relates to a NAND flash memory device and method of reading the same, and more particularly, to a NAND flash memory device capable of reducing leakage currents therein.

2. Discussion of Related Art

A NAND flash memory device is comprised of memory cells serially connected between a drain selection transistor and a source selection transistor in the unit of 16 or 32 in number. A single block is defined as a group of memory cells associated with a cell string sharing the same wordline.

It is general to distinguish the cell blocks into selected cell blocks and deselected cell blocks for a read operation in accordance with conditions of voltages applied to the cell blocks.

First, considering voltage conditions associated with a selected cell block during a read operation, 0V is applied to a selected wordline through an X-decoder, while 4.5V is applied to pass wordlines, the drain selection transistor, and the source selection transistor. 0V is applied to a common source line and a bulk, while 1V is applied to a bitline.

On the other side, considering voltage conditions associated with deselected cell blocks during a read operation, the X-decoder makes all of wordlines, drain selection transistors, and source selection transistors be floated. The source selection transistors are conductive over a selected cell block and deselected cell blocks. A source selection transistor of a deselected cell block may be coupled to 4.5V of voltage. Voltage conditions for a common source line, a bulk and bitlines are identical to those of the selected cell block.

With such voltage conditions, leakage currents arising from drain selection transistors and source selection transistors may cause malfunctions in the NAND flash memory device. Usually, a NAND cell array constructed of units of cell strings basically has a very small ON-current of 200 nA through 400 nA. In order to obtain a short sensing time, it is necessary to control leakage currents to be generated from the deselected cell blocks.

In addition, a NAND flash memory cell is confined to have a leakage current of several pico-Amperes (pA) under the voltage condition of 8V in order to prevent program disturbance due to junction leakage effects. Therefore, it is desired to form a deep junction structure even in the dimension of a memory cell with a gate length 0.1 µm and a selection transistor with a gate length 0.18 µm. Such shrinking-down in morphological configuration in the NAND flash memory device is inevitable to be weak in junction-to-junction leakage, i.e., a punch-through.

SUMMARY OF THE INVENTION

Accordingly, the present invention is directed to solve the aforementioned problems, providing a NAND flash memory device and method of reading the same, capable of reducing leakage currents by increasing source-side resistance of selection transistors during a read operation.

The prevent invention provides a NAND flash memory device comprising: a cell block including a string selector for transferring a plurality of bitline signals in accordance with a local string selection signal, a source selector for transferring a common source line signal in accordance with a local source selection signal, a cell string unit for storing predetermined data in accordance with the bitline signals, the common source line, and a plurality of local wordline signals; an X-decoder for transferring a global string selection signal, a global source selection signal, a plurality of global wordline signals each to the local string selection signal, the local source selection signal, and the local wordline signals; and a switching circuit for applying a ground voltage signal to the local string selection signal and the local source selection signal in accordance with a predetermined control signal.

The present invention also provides a method of reading a NAND flash memory device including: a plurality of cell blocks each of which includes a plurality of cell strings serially connected between a plurality of string selection transistors connected to a plurality of bitlines and a plurality of source selection transistors connected to a common source line, a local string selection line connected to gate terminals of a plurality of string selection transistors, a local source selection line connected to gate terminals of a plurality of source selection transistors, and a plurality of local wordlines connected to gate terminals of memory cells in the cell strings; an X-decoder which includes a string transmission transistor connected between a global string selection line and the local string selection line, a source transmission transistor connected between a global source selection line and the local source selection line, and a plurality of wordline transmission transistors connected between a plurality of global wordlines and a plurality of local wordlines, all the transistors being operable by an operation voltage; a switch circuit which includes a string discharge transistor connected between a ground voltage and the local string selection line, and a source discharge transistor connected between the ground voltage and the local source selection line, all the transistors of the switching circuit being driven by a control voltage; and a page buffer for applying a detection voltage to the bitlines in response to a read operation signal to sense programmed and erased states of the memory cells in accordance with a condition of the detection voltage. The method is comprised of the steps of: applying global string and source selection voltages to the X-decoder, applying a pass voltage to a plurality of deselected wordlines while a read voltage is applied to a selected wordline, and applying the operation voltage of logical high level to the X-decoder connected to the selected cell block while applying the operation voltage of logical low level to the X-decoder of the deselected cell block; applying the control voltage of logical low level to the switching circuit coupled to the selected cell block while applying the control voltage of logical high level to the switching circuit coupled to the deselected cell block; and applying the ground voltage to the common source line and a bulk and sensing variation of the detection voltage after applying the detection voltage to the selected bitline by way of the page buffer.

BRIEF DESCRIPTION OF THE DRAWINGS

A more complete understanding of the present invention may be had by reference to the following description when taken in conjunction with the accompanying drawings in which.

DETAILED DESCRIPTION OF PREFERRED EMBODIMENTS

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

In the embodiment of the present invention, a single cell block is composed of cell strings grouped with sharing wordlines, each cell string being constructed of a plurality of memory cells. Each cell string constituting the cell block is connected to a global bitline in parallel with a plural number of 1024 or 2048. And, as the cell blocks are arranged in the form of mirror image that is symmetrical on the selection transistor, a string outside junction of the selection transistor is shared by adjacent cell blocks.

For high integration, it is efficient to apply a gate bias to a string selection transistor, which is connected to a bitline that is an input/output way of data, independent from its corresponding cell block. It is also desirable for a source selection transistor, which is connected to a common source line, to share a gate bias with its adjacent source selection transistor, or to be coupled with another gate bias.

For all cell blocks during a read operation in the NAND flash memory device, 0V is applied to source lines while a voltage about 1.3V in maximum is applied to bitlines. A leakage current at the bitlines is negligible, but another leakage current occurring between sources and drains in the string selection transistors or in the source selection transistors flows with insignificant amount. Furthermore, the leakage current through the selection transistors is magnified to 1024 times because the bitlines are connected with 1024 cell strings in parallel.

Figure 1:
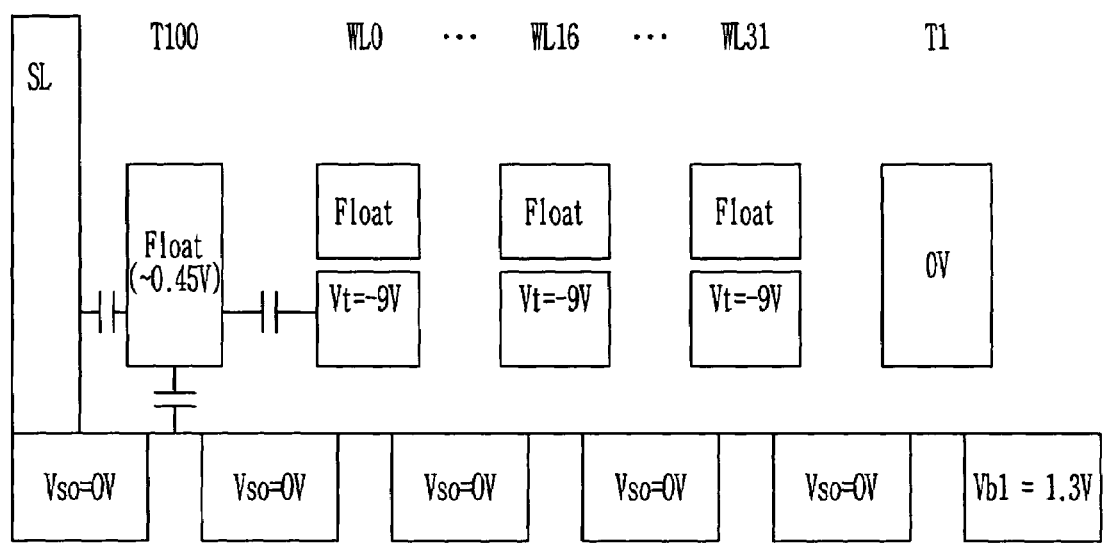
FIG. 1 is a schematic diagram illustrating the feature that a gate voltage of 0V is applied to string selection transistors of deselected cell blocks while source selection transistors thereof are being floated.

FIG. 1 is a schematic diagram illustrating the feature that a gate voltage of 0V is applied to string selection transistors of deselected cell blocks while source selection transistors thereof are being floated.

Referring to FIG. 1, an operating feature is as follows when a gate voltage of 0V is applied only to a string selection transistor T1 of a deselected cell block while a source selection transistor T10 thereof is being floated. If memory cells of a cell string are all situated in an erased state, almost the memory cells have their threshold voltages of −7V through −9V (Vt=−9V). At this time, floating gates of the memory cells are charged with positive charges. Accordingly, the memory cells are fully turned on in fact, considering capacitive coupling effects, even when the wordlines of the memory cells are floated by the condition that potentials of the floating gates are laid on 4.0V through 5.0V.

And, the source selection transistor T10 has a potential about 0.4V through 0.5V by coupling capacitance between an adjacent memory cell, a source line, and a semiconductor substrate. Thereby, the source selection transistor T10 is nearly turned on.

As aforementioned, since serial resistance over the cell string from the source selection transistor T10 on side of the source of the string selection transistor T1 is reduced remarkably, a leakage current flows therethrough. Therefore, if it is possible to inhibit a turn-on of the source selection transistor although impossible to prevent the memory cell from being turned on, the leakage current can be reduced over every cell string by increasing source-side resistance of the string selection transistor.

It will be described about such an operation of reading operation in conjunction with a structure of the NAND flash memory device, with reference to the drawings.

Figure 2:
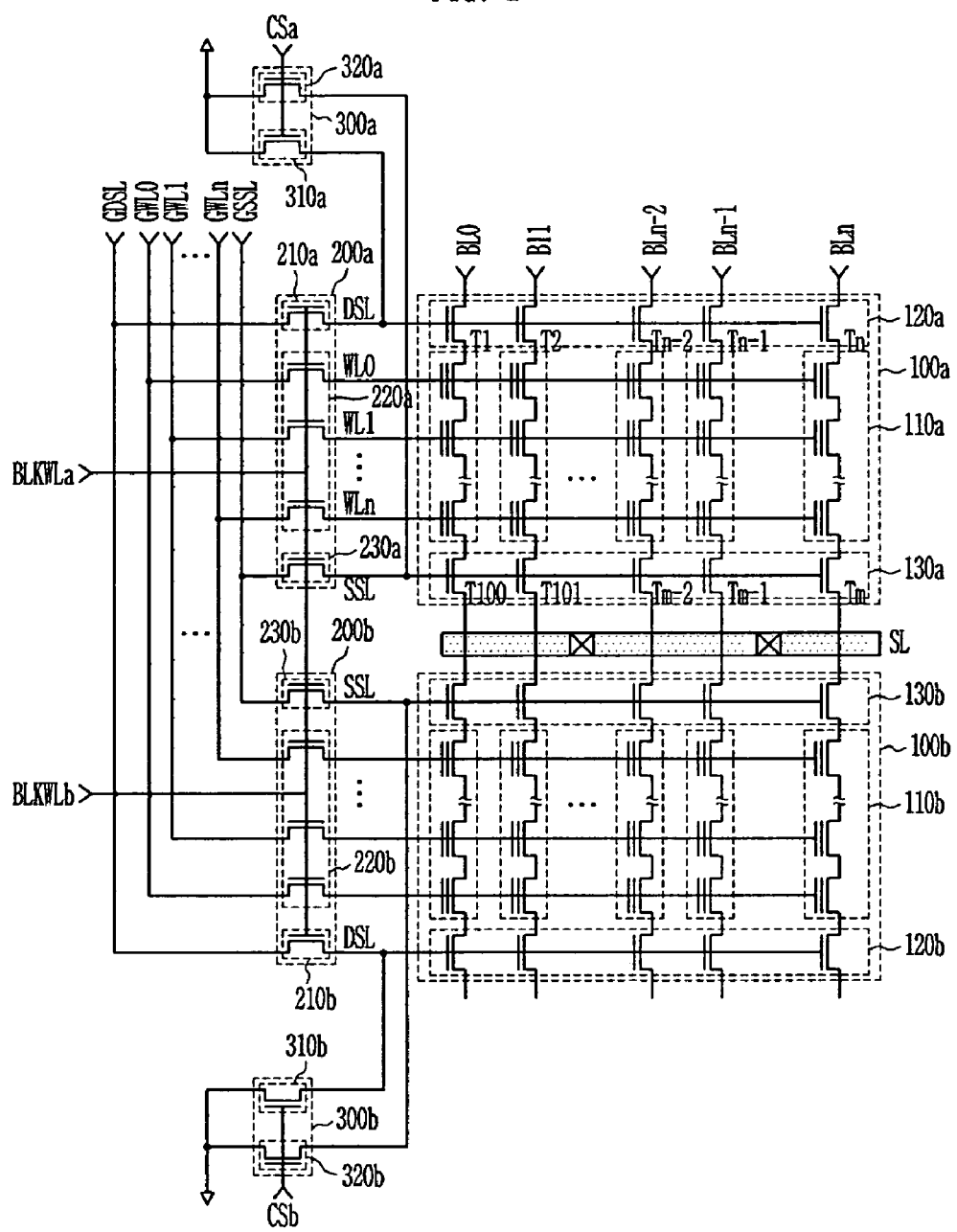
FIG. 2 is a circuit diagram of a NAND flash memory device in accordance with the present invention.

FIG. 2 is a circuit diagram of a NAND flash memory device in accordance with the present invention.

Referring to FIG. 2, the NAND flash memory device of the present invention is comprised of a string selector 120 for transferring a plurality of bitline signals BL in accordance with a local string selection signal DSL, a source selector 130 for transferring a common source line signal SL in accordance with a local source selection signal SSL, a cell block 100 including cell string units 110 for storing predetermined data under the control of a plurality of bitlines BL, the common source line SL, and a plurality of local wordline signals WL0~WLn, an X-decoder 200 for transferring a global string selection signal GDSL, a global source selection signal GSSL, a plurality of global wordline signals GWL0~GWLn each to a local string selection signal DSL, the local source selection signal SSL, and a plurality of the local wordline signals WL0~WLn in accordance with a operation signal BLKWL, and a switching circuit 300 for applying a ground voltage signal to the local string selection signal DSL and the local source selection signal SSL in accordance with a predetermined control signal CS.

The NAND flash memory device may also include a page buffer (not shown) for applying a detection voltage to the bitlines BL in response to a read operation signal (not shown) and for sensing cell states of programming and erasing.

The string selector 120 of the cell block 100 includes a plurality of string selection transistors T1~Tn connected each to the plural bitlines BL to transfer bitline BL signals in accordance with the local string selection signal SSL. The source selector 130 is connected to the common source line SL, including a plurality of source selection transistors T100~Tm to transfer the common source line signal SL in response to the common source selection signal SSL. The cell string unit, which includes a plurality of cell strings where a plurality of memory cells are connected between the plural string selection transistors T1~Tn and the plural source selection transistors T100~Tm in series, store or erase predetermined data in response to the bitline signals BL, the common source line signal SSL, and the wordline signals WL0~WLn, the local wordlines being coupled each to gates of the memory cells located on the same position in the cell strings.

The X-decoder 200 includes a string transmission transistor 210 for transferring the global string selection signal GDSL to the local string selection signal DSL in accordance with the operation signal BLKWL, a source transmission transistor 230 for transferring the global source selection signal GSSL to a local source selection signal SSL, and a plurality of wordline transmission transistors 220 for transferring the plural global wordline signals GWL0~GWLn to the local wordline signals WL0~WLn.

The switching circuit 300 includes a string discharge transistor 310 to connect the local string selection signal DSL to the ground voltage, and a source discharge transistor 320 to connect the local source selection signal SSL to the ground voltage.

Here, the source selectors 130a and 130b between the adjacent cell blocks 100a and 100b may be electrically connected with each other to receive the same one of the local source selection signal SSL in common, or electrically isolated from each other to independently receive the local source selection signals SSL. Otherwise, the circuit arrangement for the source selector 130 may be configured to make the local source selection signal SSL be applied to more than two source selectors 130 in common.

It is preferred to use NMOS transistors as the plural string selection transistors T1~Tn and the plural source selection transistors T100~Tm. A first cell string among the plural cell strings is coupled to each of first transistors T1 and T100 between the plural string selection transistors T1~Tn and the plural source selection transistors T100~Tm. The first memory cells in the plural cell strings are operable in accordance with the first wordline signal WL0. It is preferred to serially arrange the memory cells in the cell string 110 with a plurality of number of 16.

It is preferred to use high voltage NMOS transistors which are operable in the voltage of 1V through 25V, as the string transmission transistor 210, the source transmission transistor 230, and the plural wordline transmission transistor 220. In other words, the high voltage NMOS transistors need to have a junction breakdown voltage be operable over 20V. It is also preferred to use the high voltage NMOS transistor with a negative high voltage transistor formed in a semiconductor substrate without ion implantation.

It is preferable to use a high voltage NMOS transistor or a general NMOS transistor as the string discharge transistor 310 and the source discharge transistor 320.

In the NAND flash memory device of the present invention, it is preferred to arrange the cell blocks 100 in the number of plurality of 1024. And, as aforementioned, it is possible to couple gate terminals of at leant more than two source selection transistors to a single line, or to couple the gate terminals to separated lines independently from each other. The number of the source selection transistors can be reduced if the gate terminals are coupled in common, while independent voltages can be applied thereto if the gate terminals are coupled with electrically separated lines from each other.

With the structure according to the present invention, a procedure for reading data from a predetermined memory cell of a selected cell block is as follows. During this, it will be assumed that a selected cell block is referred to as the numeral 100a of FIG. 2 while a deselected cell block is referred to as the numeral 100b of FIG. 1.

In a NAND flash memory device being comprised of: a plurality of the cell blocks 100 each of which includes a plurality of the cell strings 110 serially connected between the plural string selection transistors T1~Tn connected to the plural bitlines BL0~BLn and the source selection transistors T100~Tm connected to the common source line SL, the local string selection line DSL connected to the gate terminals of the plural string selection transistors T1~Tn, the local source selection line SSL connected to the gate terminals of the plural source selection transistors T100~Tm, and the plural local wordlines WL0~WLn connected to the gate terminals of the memory cells in the cell strings; the X-decoder 200 which includes the string transmission transistor 210 connected between the global string selection line GDSL and the local string selection line DSL, the source transmission transistor 230 connected between the global source selection line GSSL and the local source selection line SSL, and the plural wordline transmission transistors 220 connected between a plurality of the global wordlines GWL0~GWLn and a plurality of the local wordlines WL0~WLn, all the transistors of being operable by the operation voltage BLKWL; the switch circuit 300 which includes the string discharge transistor 310 connected between the ground voltage and the local string selection line DSL, and the source discharge transistor 320 connected between the ground voltage and the local source selection line SSL, all the transistors being driven by the control voltage CS; and the page buffer (not shown) for applying a detection voltage to the bitlines BL in response to a read operation signal (not shown) to sense programming and erasing states of the memory cells in accordance with conditions of the detection voltage, global string and source selection voltages are applied to the X-decoder 200 and pass voltages are applied to a plurality of deselected wordlines while a read voltage is applied to a selected wordline. The operation voltage BLKWLa of logical high level is applied to the X-decoder 200a connected to the selected cell block 100a while the operation voltage BLKWLb of logical low level is applied to the X-decoder 200b of the deselected cell block 100b.

The control voltage CSa of logical low level is applied to the switching circuit 300a coupled to the selected cell block 100a, while the control voltage CSb of logical high level is applied to the switching circuit 300b coupled to the deselected cell block 100b.

The ground voltage is applied to the common source line SL and the bulk (not shown). After applying the detection voltage to a selected bitline by way of the page buffer, it senses the detection voltage.

In this embodiment, the sequence of applying the aforementioned voltages is variable in accordance with a way of reading the device. For instance, a predetermined voltage may be applied to the X-decoder 200 after applying the control voltage is applied to the switching circuit 300.

It is preferred for the global string selection voltage, the global source selection voltage, and the pass voltage to be used in the range of 4.0V through 5.0V, while the read voltage uses the ground voltage.

It is preferable to use the operation voltage BLKWLa of logical high level, which is applied to the X-decoder 200a coupled to the selected cell block 100a, in the range of 4.0V+2 Vt through 5.0V+2 Vt, while it is preferable to use the operation voltage BLKWLb of logical low level, which is applied to the X-decoder 200b coupled to the deselected cell block 100b, with the ground voltage. The value Vt represents a threshold voltage of transistors in the X-decoder 200.

It is proper for the detection voltage to be used in the range of 0.8V through 1.5V.

Hereinafter, the voltages used in a read operation of the NAND flash memory device are summarized in the following Table 1, in accordance with the preceding description.

Table 1 represents the conditions of the voltages applied to the NAND flash memory device according to the present invention.

TABLE 1

| Read | Selected block | Deselected block |
| --- | --- | --- |
| Selected wordline | 0 V | Floating |
| Deselected wordlines | 4.5 V | Floating |
| DSL | 4.5 V | 0 V |
| SSL | 4.5 V | 0 V |
| SL | 0 V | 0 V |
| BL | 1 V | 1 V |
| Bulk | 0 V | 0 V |
| BLKWL | 4.5 V + 2 Vt | 0 V |
| CS | 0 V | Vcc |

A read operation according to the present invention is as follows, referring to Table 1.

It selects a memory cell to be read out by an input of an external address, and defines a cell block containing the selected memory cell as the selected cell block 100a.

The global string selection voltage, the global source selection voltage, and the pass voltage of 4.5V for each, are applied to the global string selection line GDSL, the global source selection line GSSL, and the deselected global wordline GWL, of the X-decoder 200, respectively, while 0V is applied to the selected global wordline GWL.

The operation voltage BLKWLa of 4.5V+2 Vt is applied to the X-decoder 200a coupled to the selected cell block 100a, while the operation voltage BLKWLb of 0V is applied to the X-decoder 200b coupled to the deselected cell block 100b. The voltage of 0V is applied to the switching circuit 300a coupled to the selected cell block 100a, while the power source voltage Vcc is applied to the switching circuit 300b coupled to the deselected cell block 100b.

As a result, the local string selection voltage, the local source selection voltage, and the pass voltage, of 4.5V, are applied to the local string selection line DSL, the local source selection line SSL, and the local wordline WL, of the selected cell block 100a, respectively, while 0V is applied to the selected local wordline WL. On the other hand, all local wordlines WL of the deselected cell block 100b are floated while 0V is applied to the local string selection line DSL and the local source selection line SSL therein.

The voltage of 0V is applied to the common source line SL and the bulk, while the detection voltage of 1V is applied to a selected bitline through the page buffer coupled to the bitline BL. After a predetermined time, the page buffer sense a variation of the detection voltage of 1V that has been applied to the bitline BL and thereby detects data stored in the selected memory cell. During this, the detection voltage staying on the selected bitline is discharged or maintained dependent on a threshold voltage of the selected memory cell that is conditioned in a programmed state or an erased state.

Consequently, a bitline leakage current becomes lower when reading a programmed cell and an ON/OFF current ratio between programmed and erased memory cells increases. Therefore, a sensing time for the device becomes shorter and a read trip range becomes wider, which prevents variation of threshold voltages due to data retention and read disturbance. In other words, it is possible to increase a margin for variation of the page buffer of 2 K byte.

Figure 3:
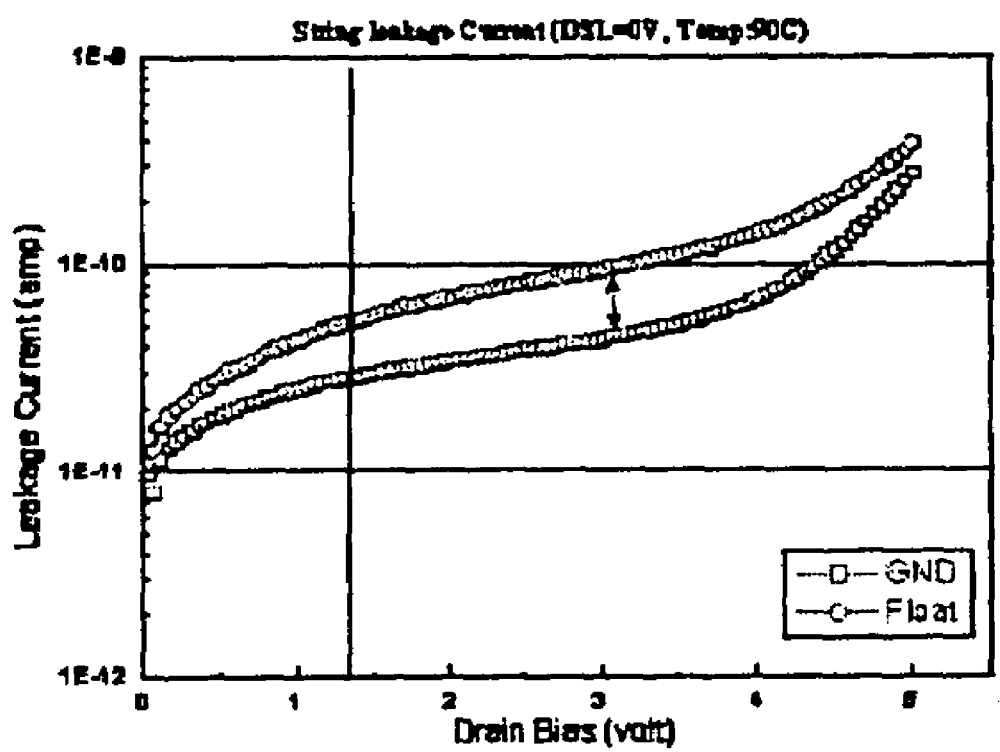
FIGS. 3 and 4 are graphs showing leakage currents in the NAND flash memory device in accordance with the present invention.

FIGS. 3 and 4 are graphic diagrams showing leakage currents in the NAND flash memory device in accordance with the present invention.

FIG. 3 results from monitoring leakage currents in the cases of holding the source selection line on the floating state and 0V when a threshold voltage of a memory cell is about −5V in a test pattern. It can be seen that since a capacitive coupling ratio between the source selection line and its adjacent wordline is small, a difference of the leakage currents is large with two through three times therebetween even though an induced potential is just 0.2V through 0.3V. It means that the leakage current decreases when the voltage of 0V is forcibly applied thereto rather than when the source selection line is floated.

Figure 4A:
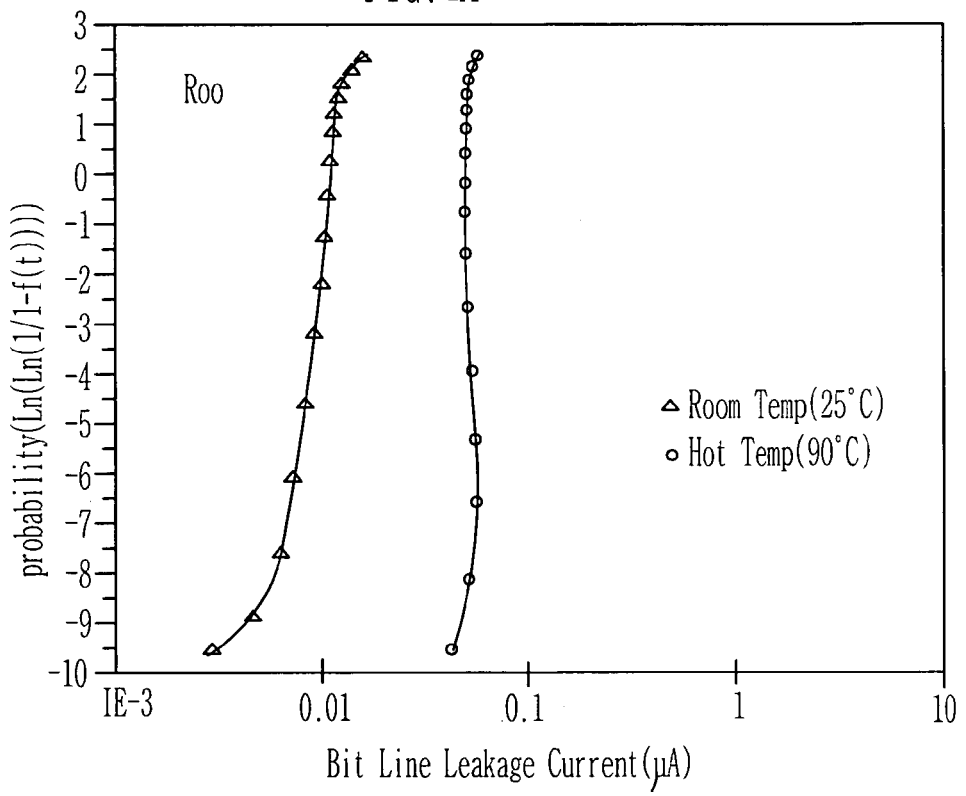
Figure 4B:
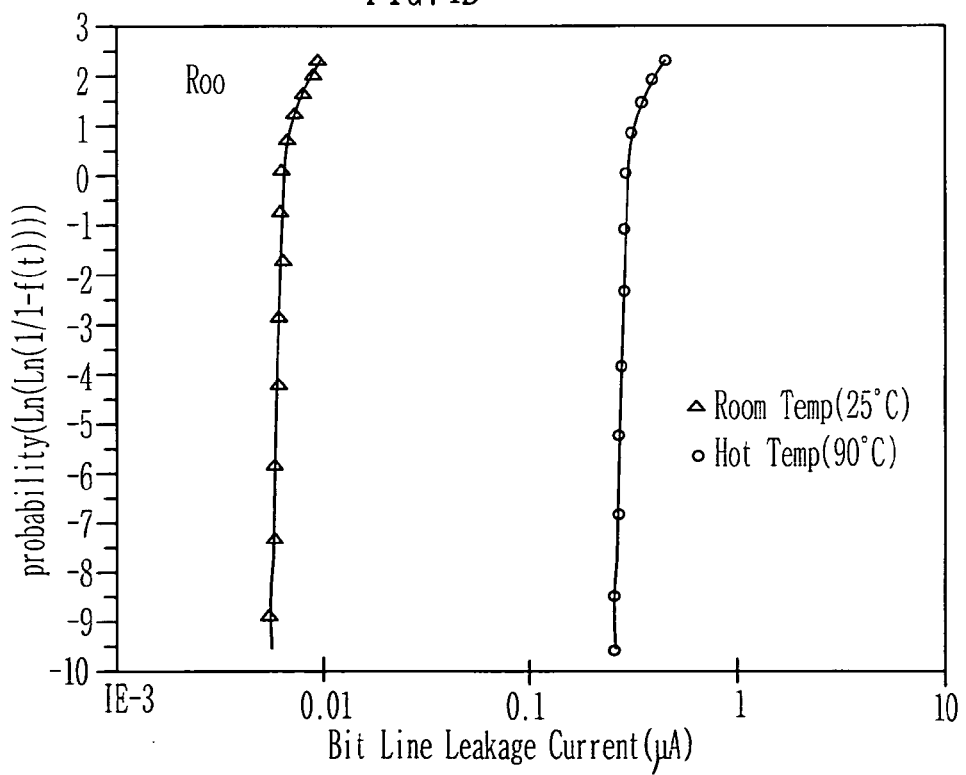

FIG. 4A results from monitoring leakage currents when the source selection line is set on 0V. FIG. 4B results from monitoring leakage currents when the source selection line is floated in a conventional 512M NAND flash memory device with 1024 cell blocks. It can be seen that the present case of FIG. 4A denotes a decreased pattern of leakage current rather than the conventional case of FIG. 4B, more uniform as well. As a result, the present case shown in FIG. 4A has a quarter of the leakage current from the conventional case shown in FIG. 4B.

As aforementioned, the present invention offers advantages of preventing leakage currents due to back-bias effects as increasing resistance of the drain selection lines, by independently applying the ground voltage to the transistor for the source selection and to the transistor for the string selection of the deselected cell block, during the reading operation.

Further, a bitline leakage current becomes lower, which results to increase an ON/OFF current ratio between programmed and erased memory cells. Therefore, a sensing time for the device becomes shorter and a read trip range becomes wider, which prevents variation of threshold voltages due to data retention and read disturbance.

Moreover, it is possible to increase a margin for variation of threshold voltage and to increase a margin for page buffer variation.

In addition, it is possible to isolate the source selection transistors between cell blocks so as to independently applying voltages to the source selection lines, and to electrically connect the source selection transistors between adjacent cell blocks so as to reduce the number of the source discharge transistors.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A NAND flash memory device comprising:
   a cell block including a string selector for transferring a plurality of bitline signals in accordance with a local string selection signal, a source selector for transferring a common source line signal in accordance with a local source selection signal SSL, a cell string unit for storing predetermined data in accordance with a plurality of bitline signals, the common source line signal, and a plurality of local wordline signals;
   an X-decoder for transferring a global string selection signal, a global source selection signal, and a plurality of global wordline signals each to the local string selection signal, the local source selection signal, and a plurality of the local wordline signals in accordance with an operation signal; and
   a switching circuit for applying a ground voltage signal to the local string selection signal and the local source selection signal in accordance with a predetermined control signal.

2. The NAND flash memory device as set forth in claim 1, further comprising:
   a string discharge transistor for transferring the ground voltage to the local string selection signal in accordance with the control signal; and
   a source discharge transistor for transferring the ground voltage to the local source selection signal.

3. The NAND flash memory device as set forth in claim 2, wherein the control signal applied to the switching circuit coupled to a selected cell block is logically low level while the control signal applied to the switching circuit couple to a deselected cell block is logically high level.

4. The NAND flash memory device as set forth in claim 1, further comprising a page buffer for applying a detection voltage to the bitline in accordance with a read operation signal and for sensing programmed and erased states of a memory cell in accordance with a state of the detection voltage.

5. The NAND flash memory device as set forth in claim 1, wherein the cell block comprises:
   a plurality of string selection transistors connected to a plurality of bitlines, transferring the bitline signals in accordance with the local string selection signal;
   a plurality of source selection transistors connected to a common source line, transferring the common source line signal in accordance with the local source selection signal; and
   a plurality of cell strings in which a plurality of memory cells are connected between the string selection transistors and the source selection transistors in series;
   wherein the local wordlines are coupled to each gate of the memory cells arranged on the same position in the cell strings so as to store predetermined data in accordance with the bitline signals, the common source line signal, and the local wordline signals.

6. The NAND dash memory device as set forth in claim 1, wherein the Xdecoder comprises:
   a string transmission transistor for transferring the global string selection signal to the local string selection signal in accordance with the operation signal;
   a source transmission transistor for transferring the global source selection signal to the local source transmission signal; and
   a plurality of wordline transmission transistors for transferring the global wordline signals to the local wordline signals.

7. The NAND flash memory device as set forth in claim 1, wherein the source selector between the cell blocks are electrically connected with each other to apply the local source selection signal to the source selectors of at least more than two cell blocks in common.

8. The NAND flash memory device as set forth in claim 1, wherein the source selector between the cell blocks are electrically isolated from each other to independently apply the local source selection signal to the source selector of the cell block.

9. A method of reading a NAND flash memory device, comprising:
   a plurality of cell blocks each of which includes a plurality of cell strings serially connected between a plurality of string selection transistors connected to a plurality of bitlines and a plurality of source selection transistors connected to a common source line;
   a local string selection line connected to gate terminals of a plurality of string selection transistors, a local source selection line connected to gate terminals of a plurality of source selection transistors, and a plurality of local wordlines connected to gate terminals of memory cells in the cell strings;
   an X-decoder which includes a string transmission transistor connected between a global string selection line and the local string selection line, a source transmission transistor connected between a global source selection line and the local source selection line, and a plurality of wordline transmission transistors connected between a plurality of global wordlines and a plurality of the local wordlines, all the transistors being operable by an operation voltage;
   a switch circuit which includes a string discharge transistor connected between a ground voltage and the local string selection line, and a source discharge transistor connected between the ground voltage and the local source selection line, all the transistors of the switching circuit being driven by a control voltage; and
   a page buffer for applying a detection voltage to the bitlines in response to a read operation signal to sense programmed and erased states of the memory cells in accordance with a condition of the detection voltage, the method comprising the steps of:
   applying global string and source selection voltages to the X-decoder, applying a pass voltage to a plurality of deselected wordlines while applying a read voltage to a selected wordline, and applying the operation voltage of logical high level to the X-decoder connected to the selected cell block while applying the operation voltage of logical low level to the X-decoder connected to the deselected cell block;
   applying the control voltage of logical low level to the switching circuit coupled to the selected cell block while applying the control voltage of logical high level to the switching circuit coupled to the deselected cell block; and
   applying the ground voltage to the common source line and a bulk and sensing variation of the detection voltage after applying the detection voltage to the selected bitline by way of the page buffer.

10. The method as set forth in claim 9, wherein the global string selection voltage, the global source selection voltage and the pass voltage are used in a range of 4.0V through 5.0V, while the read voltage uses a ground voltage.

11. The method as set forth in claim 9, wherein the operation voltage of logical high level, which is applied to the X-decoder coupled to the selected cell block, is used in a range of 4.0V+2 Vt through 5.0V+2 Vt, while the operation voltage of logical low level, which is applied to the X-decoder coupled to the deselected cell block, uses a ground voltage.

12. The method as set forth in claim 9, wherein the control voltage applied to the switching circuit coupled to the selected cell block is logically low level, while the control voltage applied to the switching circuit coupled to the deselected cell block is logically high level.

* * * * *